United States Patent [19]

Uetani et al.

[11] Patent Number: 5,124,228
[45] Date of Patent: Jun. 23, 1992

[54] POSITIVE PHOTORESIST COMPOSITION CONTAINING ALKALI-SOLUBLE RESIN AND O-QUINONE DIAZIDE SULFONIC ACID ESTER

[75] Inventors: Yasunori Uetani, Minoo; Makoto Hanabata, Hyogo; Hirotoshi Nakanishi, Osaka; Koji Kuwana, Fujiidera; Fumio Oi, Ashiya, all of Japan

[73] Assignee: Sumitomo Chemical Co., Ltd., Osaka, Japan

[21] Appl. No.: 381,298

[22] Filed: Jul. 18, 1989

[30] Foreign Application Priority Data

Jul. 20, 1988 [JP] Japan ................. 63-182434

[51] Int. Cl.$^5$ ............................................. G03F 7/023
[52] U.S. Cl. .................................... 430/192; 430/165; 430/193
[58] Field of Search .............. 430/192, 193, 165; 534/556, 557

[56] References Cited

U.S. PATENT DOCUMENTS

| | | | |
|---|---|---|---|
| 4,626,492 | 12/1986 | Eilbeck | 430/193 |
| 4,812,551 | 3/1989 | Oi et al. | 430/192 |
| 4,837,121 | 6/1989 | Blakeney et al. | 430/192 |
| 4,894,311 | 1/1990 | Uenishi et al. | 430/193 |

FOREIGN PATENT DOCUMENTS

| | | | |
|---|---|---|---|
| 0126266 | 11/1984 | European Pat. Off. | |
| 58-150948 | 9/1983 | Japan | |
| 63-110446 | 5/1988 | Japan | 430/193 |
| 64-17049 | 1/1989 | Japan | |
| 1-156738 | 7/1989 | Japan | |

OTHER PUBLICATIONS

English Language Translation of Japanese Publication #60-121445, Published Jun. 28, 1985, (Hosaka et al.).

Primary Examiner—Richard L. Schilling
Assistant Examiner—Christopher G. Young
Attorney, Agent, or Firm—Birch, Stewart, Kolasch & Birch

[57] ABSTRACT

A quinone diazide sulfonic acid ester of a phenol compound of the general formula (I) or (II):

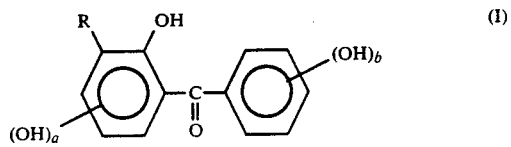

or

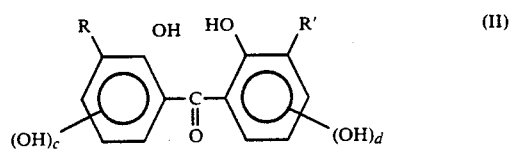

wherein a, c and d are the same or different and a number of 0 to 3, provided that when a is 0 or 3, b is a number of 0 to 3 or when a is 1 or 2, b is 0, 1 or 2, and a+b and c+d are not less than 2; R and R' are the same or different and an alkyl group or an aryl group provides a positive resist composition having a high $\gamma$-value.

15 Claims, No Drawings

POSITIVE PHOTORESIST COMPOSITION CONTAINING ALKALI-SOLUBLE RESIN AND O-QUINONE DIAZIDE SULFONIC ACID ESTER

BACKGROUND OF THE INVENTION

1. Field of the Invention

The present invention relates to a resist composition which comprises a sensitizer and is sensitive to ultraviolet rays (G-line, H-line, I-line and so on), far ultraviolet rays (excimer laser and so on), electron rays and radio active rays such as X rays, and also to a sensitizer to be used in a positive resist composition.

2. Description of the Related Art

A composition containing a compound having a quinone diazide group such as a naphthoquinone diazide group, a benzoquinone diazide group, etc. and an alkali-soluble resin finds use as a positive resist, because upon exposure to ultraviolet rays, the quinone diazide group decomposes to form a carboxyl group whereby the originally alkali-insoluble composition becomes alkali-soluble. A condensation product of a phenol compound (e.g. trihydroxybenzophenone, tetrahydroxybenzophenone and so on) with a quinone diazide compound is used as a sensitizer.

However, particularly with integrated circuits, miniaturization has proceeded with a rise in the integration level, which results in demands for formation of patterns of submicron order and more excellent resolution (high $\gamma$-value). As a result, the conventional compositions cannot improve the $\gamma$-value to the desired level.

For example, if the amount of quinone diazide group is increased to improve the $\gamma$-value, serious problems such as deterioration of sensitivity and increase of residues after developing arise.

SUMMARY OF THE INVENTION

One object of the present invention is to provide a positive resist composition which has the high $\gamma$-value and can overcome the problems associated with the conventional positive resist compositions.

Another object of the present invention is to provide a sensitizer consisting of a quinone diazide sulfonic acid ester of a phenol compound, which sensitizer is used in a positive resist composition.

Accordingly, the present invention provides a positive resist composition which comprises an alkali-soluble resin and at least one quinone diazide sulfonic acid ester of a phenol compound of the general formula (I) or (II):

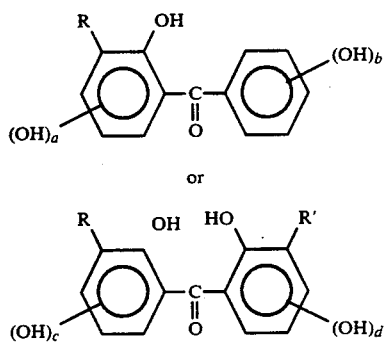

wherein a, c and d are the same or different and a number of 0 to 3, provided that when a is 0 or 3, b is a number of 0 to 3 or when a is 1 or 2, b is 0, 1 or 2, and a+b and c+d are not less than 2; R and R' are the same or different and an alkyl group or an aryl group.

DETAILED DESCRIPTION OF THE INVENTION

In the phenol compound (I) or (II), at least one of the hydroxyl groups is present at the ortho position to the carbonyl group, and an alkyl group or an aryl group is present at the ortho position to the hydroxy group.

Preferably, a+b or c+d i 2 in the phenol compound (I) or (II) because of a higher $\gamma$-value.

Preferably, R and R' is a $C_1$–$C_4$ alkyl group.

Preferred examples of the phenol compound of the formula (I) or (II) include

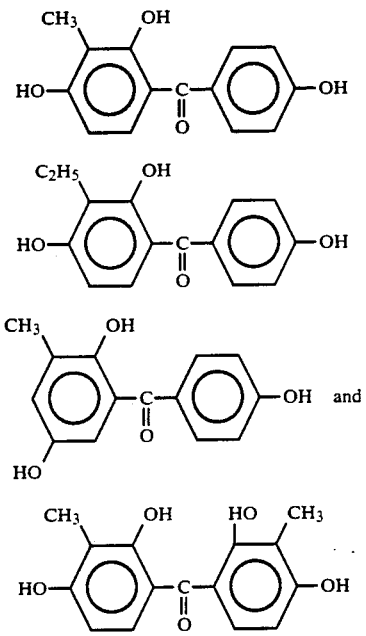

The phenol compound of the formula (I) or (II) may be prepared by a per se conventional method. For example, one of the phenol compound is prepared by a reaction of 3-methyl-2,4-dihydroxybenzoic acid with phenol in the presence of a Lewis acid such as tin(II) chloride, aluminum chloride and complexes of boron trifluoride or a sulfonic acid compound.

The quinone diazide sulfonic acid ester of the phenol compound (I) or (II) may be prepared by a per se conventional method. For example, the ester is prepared by a condensation reaction of the phenol compound with naphthoquinone diazide sulfonyl halogenide or benzoquinone diazide sulfonyl halogenide in the presence of a weak alkali such as sodium carbonate. It is preferable to carry out the reaction under such condition that an amount of a diester compound is not less than 50% by weight based on the total weight of the ester compounds.

Examples of the naphthoquinone diazide sulfonyl halogenide are naphthoquinone-(1,2)-diazide-(2)-5-sulfonyl chloride, naphthoquinone-(1,2)-diazide-(2)-4-sulfonyl chloride, benzoquinone-(1,2)-diazide-(2)-4-sulfonyl chloride and so on.

The positive resist composition of the present invention may contain two or more quinone diazide sulfonic acid esters of the phenol compound (I) or (II) in combination. The resist composition of the present invention may optionally include at least one ester of a phenol compound other than the phenol compound of the general formula (I) or (II).

Examples of the other phenol compound are hydroquinone, resorcinol, phloroglucin, 2,4-dihydroxybenzophenone, 2,3,4-trihydroxybenzophenone, tetrahydroxybenzophenones such as 2,3,3',4-tetrahydroxybenzophenone and 2,3,4,4'-tetrahydroxybenzophenone, pentahydroxybenzophenones such as 2,2',3,3',4-pentahydroxybenzophenone and 2,3,3',4,5'-pentahydroxybenzophenone, alkyl gallates, and the like.

A novolak resin is preferably used as the alkali-soluble resin. The novolak resin is prepared by an addition condensation reaction of a phenol with formaldehyde. Specific examples of the phenol used as one of the raw materials for the novolak resin include phenol, cresol, xylenol, ethylphenol, trimethylphenol, propylphenol, butylphenol, dihydroxybenzene, naphthols, etc. These phenols may be used alone or in combination.

The formaldehyde which undergoes the addition condensation reaction with the phenol can be used in the form of an aqueous solution of formaldehyde (formalin) or paraformaldehyde which is an oligomer of formaldehyde. Particularly, 37% formalin which is commercially mass produced is suitably used.

The addition condensation reaction of the phenol with formaldehyde can be carried out according to the usual method. This reaction is carried out at a temperature of from 60° to 120 °C. for 2 to 30 hours. Organic acids, inorganic acids or divalent metal salts are used as catalysts. Specifically, exemplified are oxalic acid, hydrochloric acid, sulfuric acid, perchloric acid, p-toluenesulfonic acid, trichloroacetic acid, phosphoric acid, formic acid, zinc acetate, magnesium acetate, etc.

The reaction may be carried out in the presence or absence of a solvent.

The amount of the quinone diazide sulfonic acid ester to be added to the resist composition is from 15 to 50% by weight based on the total weight of the solid components in the resist composition.

The positive photoresist is prepared by mixing and dissolving the foregoing quinone diazide compound and the novolak resin in a solvent. Preferably, the used solvent evaporates at a suitable drying rate to give a uniform and smooth coating film. Such the solvent includes ethylcellosolve acetate, methylcellosolve acetate, ethylcellosolve, methylcellosolve, propylene glycolmonomethyl ether acetate, butyl acetate, methyl isobutyl ketone, xylene, etc. To the positive photoresist composition obtained by the foregoing method, small amounts of resins, dyes, etc. may be added if desired.

With the resist composition of the present invention, the γ-value can be improved and the problems associated with increase of developing remains can be solved.

PREFERRED EMBODIMENTS OF THE INVENTION

The present invention will be illustrated more in detail with the following Examples, but it is not limited to these Examples. In Examples, "parts" are by weight.

REFERENCE EXAMPLE 1

Synthesis of the sensitizer A

In a 300 ml three-necked flask, 4.88 g of the compound (1) of the below described formula (1), 10.75 g of naphthoquinone-(1,2)-diazide-(2)-5-sulfonyl chloride (in the molar ratio of 1:2) and 168 g of dioxane were charged and stirred to achieve complete dissolution. 4.45 Gram of triethylamine was dropwise added over 30 minutes while stirring on a water bath to keep the reaction temperature at 20°–25° C. Reaction was carried out with stirring for further 4 hours at 20°–25° C. The reaction solution was then charged into ion-exchanged water, filtered and dried to obtain a sensitizer, which is referred to as sensitizer A.

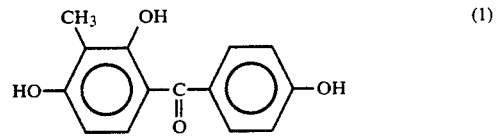

REFERENCE EXAMPLES 2–5

Synthesis of the sensitizers B, C, D and E

The same procedures as in Reference Example 1 were repeated except that the compound of the below described formula (2) (for the sensitizer B), 2,4,4'-trihydroxybenzophenone (for the sensitizer C), 2,2',4,4'-tetrahydroxybenzophenone (for the sensitizer D) or 2,3,4-trihydroxybenzophenone (for the sensitizer E) was used instead of the compound (1) to obtain a sensitizer, which is referred to as sensitizer B, C, D or E.

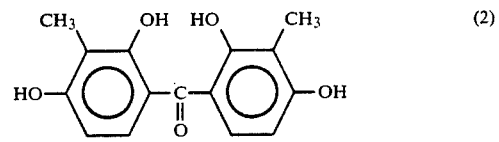

EXAMPLES 1-2 AND COMPARATIVE EXAMPLES 1-3

The sensitizer A, B, C, D or E obtained in Reference Examples 1-5 and a novolak resin in amounts shown in Table 1 were dissolved in 48 parts of ethyl cellosolve acetate to prepare a resist solution, which was filtered through a Teflon (trade mark) filter of 0.2 μm in pore size. The resist solution was coated on a silicon wafer, which had been rinsed in a usual manner, by means of a spinner so as to form a resist film of 1.3 μm in thickness. Subsequently, the silicon wafer was baked for 60 seconds on a hot plate kept at 100° C., and exposed to light while varying the exposure value stepwise by means of a reduction projection exposing apparatus (DSW 4800 with NA=0.42 manufactured by GCA) in having a wavelength of 436 nm. Thereafter, the silicon wafer was developed for 1 minute in a developing solution (SOPD manufactured by Sumitomo Chemical Company, Limited) to obtain a positive pattern. The γ-value is expressed in terms of tan θ the angle θ of which is obtained by plotting the rate of the standardized film thickness (=the retained film thickness/the original film thickness) against the exposure value and calculating the inclination of the plotted line. The γ-value and the resolution which was obtained at the same time are shown in Table 1.

TABLE 1

| | Resist Components | | |
|---|---|---|---|
| | Novolak Resin*1) (parts) | Sensitizer (parts) | γ-Value |
| Example 1 | 17 | A, 5 | 3.6 |
| Example 2 | 17 | B, 5 | 3.5 |
| Comparative | 17 | C, 5 | 2.5 |

TABLE 1-continued

| | Resist Components | | |
|---|---|---|---|
| | Novolak Resin[*1)] (parts) | Sensitizer (parts) | γ-Value |
| Example 1 Comparative Example 2 | 17 | D, 5 | 1.6 |
| Comparative Example 3 | 17 | E, 5 | 2.3 |

Note:
[*1)]Novolak Resin: A cresol mixture (the molar ratio of m-isomer to p-isomer: 7/3) was reacted with formalin (the molar ratio of formalin to cresol, 1/0.8) using oxalic acid as a catalyst under reflax to obtain a novolak resin of 9800 in weight average molecular weight calculated as polystyrene.

As understood from the results in Table 1, γ-value in Examples were higher than those in Comparative Examples.

What is claimed is:

1. A positive photoresist composition which comprises an alkali-soluble resin in admixture with a photosensitive compound comprising at least one o-quinone diazide sulfonic acid ester of a phenol compound of the general formula (I) or (II):

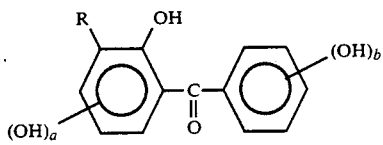

or

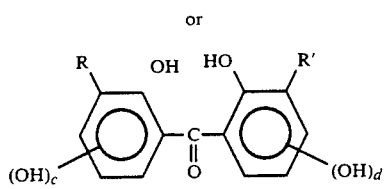

wherein a, c and d are the same or different and a number of 0 to 3, provided that when a is 0 or 3, b is a number of 0 to 3 or when a is 1 to 2, b is 0, 1 or 2, and both the sums a+b and c+d each are 2-4; R and R' are the same or different each is an alkyl group, wherein the o-quinone diazide sulfonic acid ester is present in an amount of from 15 to 50% by weight based on the total weight of the solid components in the photoresist composition wherein said o-quinone diazide sulfonic acid ester is prepared from a condensation reaction of the phenol compound with naphthoquinone diazide sulfonyl halogenide or benzoquinone diazide sulfonyl halogenide.

2. The positive photoresist composition according to claim 1, wherein the phenol compound is at least one selected from the group consisting of

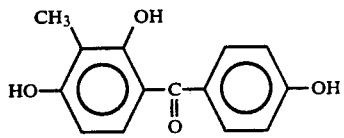

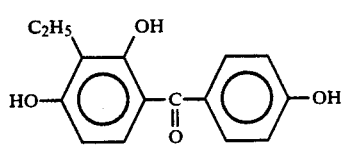

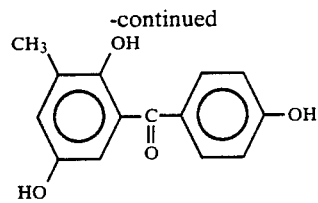

and

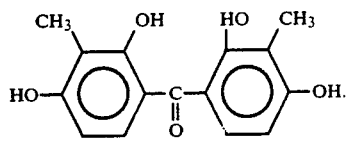

3. The positive photoresist composition according to claim 1, wherein the phenol compound is

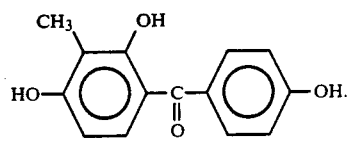

4. The positive photoresist composition according to claim 1, wherein the phenol compound is

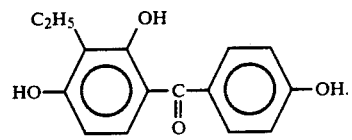

5. The positive photoresist composition according to claim 1, wherein the phenol compound is

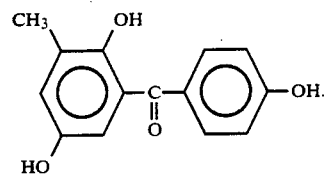

6. The positive photoresist composition according to claim 1, wherein the phenol compound is

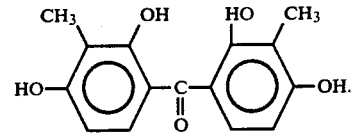

7. The positive photoresist composition according to claim 1, wherein the phenol compound is that of the formula (I).

8. The positive photoresist composition according to claim 1, wherein the phenol compound is that of formula (II).

9. The positive photoresist composition according to claim 1, wherein R and R' are each independently $C_{16}$–$C_4$ alkyl groups.

10. The positive photoresist composition according to claim 1, wherein R is a $C_1$–$C_4$ alkyl group.

11. The positive photoresist composition according to claim 8, wherein R and R' are each independently $C_1$–$C_4$ alkyl groups.

12. The positive photoresist composition according to claim 1, wherein said o-quinone diazide sulfonic acid ester is prepared from a condensation reaction of the phenol compound with a diazide sulfonyl halogenide selected from the group consisting of naphthoquinone-(1,2)-diazide-(2)-5-sulfonyl chloride, naphthoquinone-(1,2)-diazide-(2)-4-sulfonyl chloride, and benzoquinone-(1,2)-diazide-(2)-4-sulfonyl chloride.

13. The positive photoresist composition according to claim 1, wherein said composition further includes at least one o-quinone diazide sulfonic acid ester of a phenol compound selected from the group consisting of hydroquinone, resorcinol, phloroglucin, 2,4-dihydroxybenzophenone, 2,3,4-trihydroxybenzophenone, 2,3,3',4-tetrahydroxybenzophenone, 2,3,4,4'-tetrahydroxybenzophenone, 2,2',3,3',4-pentahydroxybenzophenone, 2,3,3',4,5'-pentahydroxybenzophenone, and alkyl gallates.

14. The positive photoresist composition according to claim 1, wherein the alkali-soluble resin is a novolak resin prepared by an addition condensation reaction of formaldehyde and at least one phenol selected from the group consisting of phenol, cresol, xylenol, ethylphenol, trimethylphenol, propylphenol, butylphenol, dihydroxybenzene, and naphthols.

15. The positive photoresist composition according to claim 1, wherein the alkali-soluble resin is a novolak resin.

* * * * *